United States Patent
Cooper et al.

(10) Patent No.: US 7,463,043 B2
(45) Date of Patent: Dec. 9, 2008

(54) METHODS OF PROBING AN ELECTRONIC DEVICE

(75) Inventors: Timothy E. Cooper, Discovery Bay, CA (US); Benjamin N. Eldridge, Danville, CA (US); Igor Y. Khandros, Orinda, CA (US); Rod Martens, Livermore, CA (US); Gaetan L. Mathieu, Livermore, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 11/748,988

(22) Filed: May 15, 2007

(65) Prior Publication Data

US 2007/0262767 A1    Nov. 15, 2007

Related U.S. Application Data

(63) Continuation of application No. 10/781,369, filed on Feb. 18, 2004, now Pat. No. 7,218,127.

(51) Int. Cl.
*G01R 31/02* (2006.01)
(52) U.S. Cl. .................... 324/754; 324/757; 324/758
(58) Field of Classification Search ........... None
See application file for complete search history.

(56) References Cited

U.S. PATENT DOCUMENTS

| 4,506,215 | A | 3/1985 | Coughlin |
|---|---|---|---|
| 5,012,186 | A | 4/1991 | Gleason |
| 5,436,571 | A | 7/1995 | Karasawa |
| 5,773,987 | A | 6/1998 | Montoya |
| 5,974,662 | A | 11/1999 | Eldridge et al. |
| 6,250,933 | B1 * | 6/2001 | Khoury et al. ............ 439/66 |
| 6,297,656 | B1 | 10/2001 | Kobayashi et al. |
| 6,788,086 | B2 | 9/2004 | Hantschel et al. |
| 6,850,052 | B2 * | 2/2005 | Iino et al. ............ 324/158.1 |
| 7,202,682 | B2 | 4/2007 | Cooper et al. |
| 7,218,127 | B2 | 5/2007 | Cooper et al. |
| 2004/0201392 | A1 | 10/2004 | Kim et al. |
| 2007/0170941 | A1 | 7/2007 | Cooper et al. |

FOREIGN PATENT DOCUMENTS

| DE | 19733861 | 2/1999 |
|---|---|---|
| EP | 046091 | 12/1991 |
| JP | 11-074322 | 3/1999 |

\* cited by examiner

*Primary Examiner*—Minh N Tang
(74) *Attorney, Agent, or Firm*—N. Kenneth Burraston

(57) ABSTRACT

An electronic device is moved into a first position such that terminals of the electronic device are adjacent probes for making electrical contact with the terminals. The electronic device is then moved horizontally or diagonally such that the terminals contact the probes. Test data are then communicated to and from the electronic device through the probes.

30 Claims, 13 Drawing Sheets

METHODS OF PROBING AN ELECTRONIC DEVICE

CROSS-REFERENCE TO RELATED APPLICATION(S)

This application is a continuation of U.S. patent application Ser. No. 10/781,369, filed Feb. 18, 2004 (now U.S. Pat. No. 7,218,127).

FIELD OF THE INVENTION

This invention relates generally to probing a device.

BACKGROUND

Although the present invention is generally applicable to probing any device, the present invention is particularly suited for probing an integrated circuit to test the circuit. As is known, integrated circuits are typically manufactured as a plurality of dies on a semiconductor wafer. FIG. 1 illustrates a typical test system 100 for testing such a semiconductor wafer 124. The exemplary test system shown in FIG. 1, includes a tester 102, a test head 118, a probe card 106, and a prober 120.

A semiconductor wafer 124 is placed on a chuck (also commonly referred to as a stage) 114, which typically is capable of movement in the "x," "y," and "z" directions. The chuck 114 may also be capable of being rotated (e.g., in the "θ" direction) and tilted and may be further capable of other motions as well. Once the semiconductor wafer 124 is placed on the chuck 114, the chuck is typically moved in the "x," "y," and/or "θ" directions so that terminals on the dies (not shown) of the wafer 124 align with probes 108 on the probe card 106. The chuck 114 then typically moves the wafer 124 upward in the "z" direction, bringing the terminals into contact with the probes 108. One or more cameras 122 may aid in aligning the terminals and the probes and determining contact between the probes 108 and the terminals.

Once the terminals of the dies (not shown) are in contact with the probes 108, a tester 102, which may be a computer, generates test data. The test data is communicated through one or more communication links 104 to a test head 118. The test data is communicated from the test head 118 through interconnections 116 (e.g., pogo pins) to the probe card 106 and finally to the terminals of the dies (not shown) through probes 108. Response data generated by the dies are communicated in reverse direction from the probes 108, through the probe card 106, through interconnections 116, through the probe head 118, through a communication link 104, to the tester 102.

FIGS. 2A-2C illustrate movement of the wafer 124 into contact with the probe card 106. As mentioned above and shown in FIG. 2A, terminals 220 of one or more dies 202a, 202b of wafer 124 are aligned with probes 108 of the probe card 106. The chuck 114 them moves the wafer upward such that the terminals 220 of the die 202a contact probes 108, as shown in FIG. 2B. As shown in FIG. 2C, the chuck 114 typically moves the wafer 124 beyond first contact with the terminals 220. (Movement beyond first contact is often referred to as "over travel.") This typically compresses the probes 108. The resulting spring force exerted by the probes 108 against the terminals 220 helps to create a reasonably low resistance electrical connection between the probes and the terminals. In addition, the probes 108 often wipe across the surface of the terminals 220 as the probes are being compressed. The wiping action tends to cause the tips of the probes 108 to break through any oxide or other build up on the terminals 220, again helping to create a reasonably low resistance electrical connection between the probes and the terminals.

As might be expected, compression of the probe 108 and the wiping action induce forces and stresses in the probe, which may break, damage, or reduce the useful life of a probe 108. In addition, the force exerted by the probe 108 against the terminal 220 may damage the terminal 220 and/or the wafer 124. A wafer 124 comprising material with a low "k" dielectric may be particularly susceptible to such damage. Generally speaking, the greater the friction between a probe 108 and a terminal 220, the greater such forces and stresses are likely to be. Indeed, it is possible for frictional forces to prematurely stop the wiping of the probe 108 tip across the terminal 220. This may happen, for example, if the probe 108 tip digs too deeply into the terminal 220 or if the probe tip gets caught in an irregularity on the surface of the terminal. If the probe 108 tip stops its wiping motion prematurely, the forces and stresses that build up on the probe may become particularly large (and therefore particularly likely to cause damage to the probe, terminal, and/or wafer). Although a probe 108 may dig into any type of terminal 220, a probe 108 is particularly susceptible to digging into a terminal made of a soft material (e.g., solder ball or aluminum terminals) or a terminal with a rough surface (e.g., copper terminals). Embodiments of the present invention, among other things, may reduce stresses in a probe and forces exerted by and against a probe. One non-limiting advantage of the invention is in reducing or replacing the vertical component of relative movement between the probe and the terminal as they are brought into contact by a wiping action, which reduces the forces on and stresses in the probe.

SUMMARY

This invention relates generally to probing a device and is particularly applicable to probing an electronic device (e.g., a semiconductor device) to test the device. In one embodiment, an electronic device is moved into a first position such that terminals of the electronic device are adjacent probes for making electrical contact with the terminals. The electronic device is then moved horizontally or diagonally such that the terminals contact the probes.

DETAILED DESCRIPTION OF EXEMPLARY EMBODIMENTS

The present invention relates to probing a device. This specification describes exemplary embodiments and applications of the invention. The invention, however, is not limited to these exemplary embodiments and applications or to the manner in which the exemplary embodiments and applications operate or are described herein.

Figure 3:
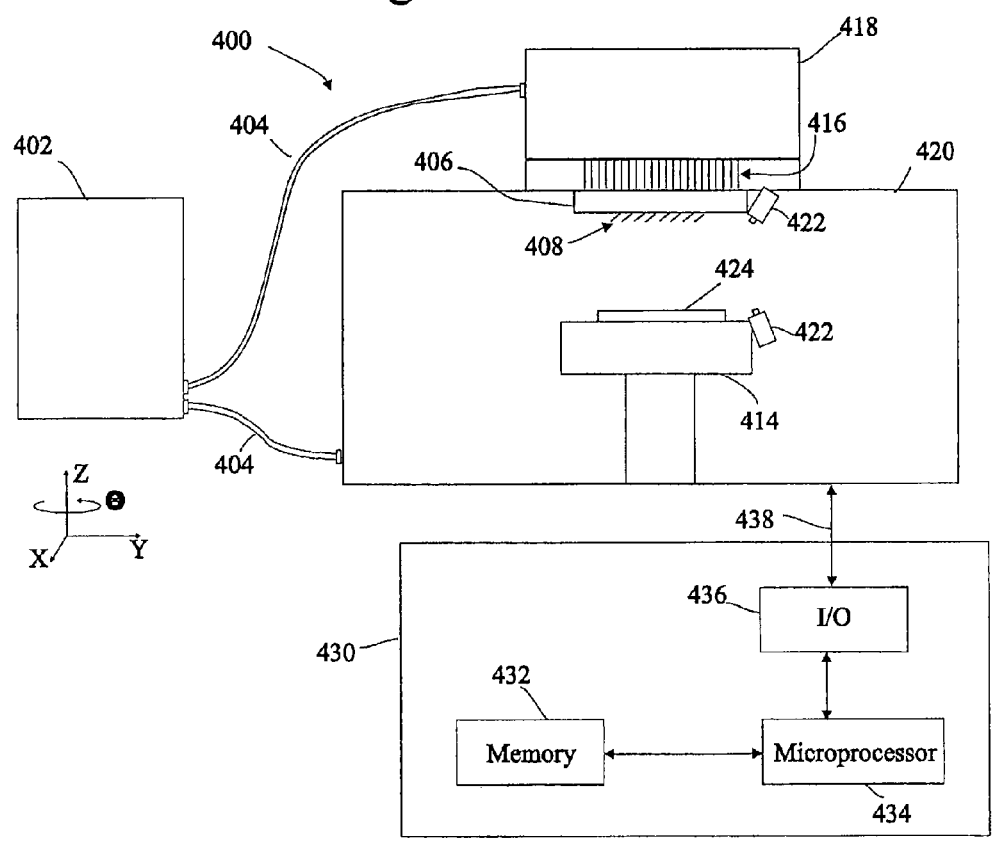
FIG. 3 illustrates an exemplary test system.

FIG. 3 illustrates an exemplary semiconductor test system 400. Test system 400 is exemplary only; other systems in which any type of probe is brought into contact with another device may be used. Nonexclusive examples of such systems include sockets for testing packaged or unpackaged semiconductor devices, or any type of test system in which a semiconductor device (packaged or unpackaged, singulated or unsingulated, diced or in wafer form) is probed. As another example, any system in which a probe is brought into contact with some sort of surface may be used. Of course, even if a semiconductor wafer test system is used, a semiconductor test system that is different than the exemplary test system 400 shown in FIG. 3 may be used. Nonlimiting examples of electronic devices that may be tested include a semiconductor wafer, a semiconductor device, a package for a semiconductor device, a package for a plurality of semiconductor devices, a semiconductor die singulated from a semiconductor wafer, a plurality of semiconductor dies singulated from a semiconductor wafer, a printed circuit board, and a wired ceramic substrate such as a space transformer. Another example is an electronic system comprising printed wiring layers, semiconductor devices, and connections between the wiring layers and the semiconductor devices.

Figure 1:
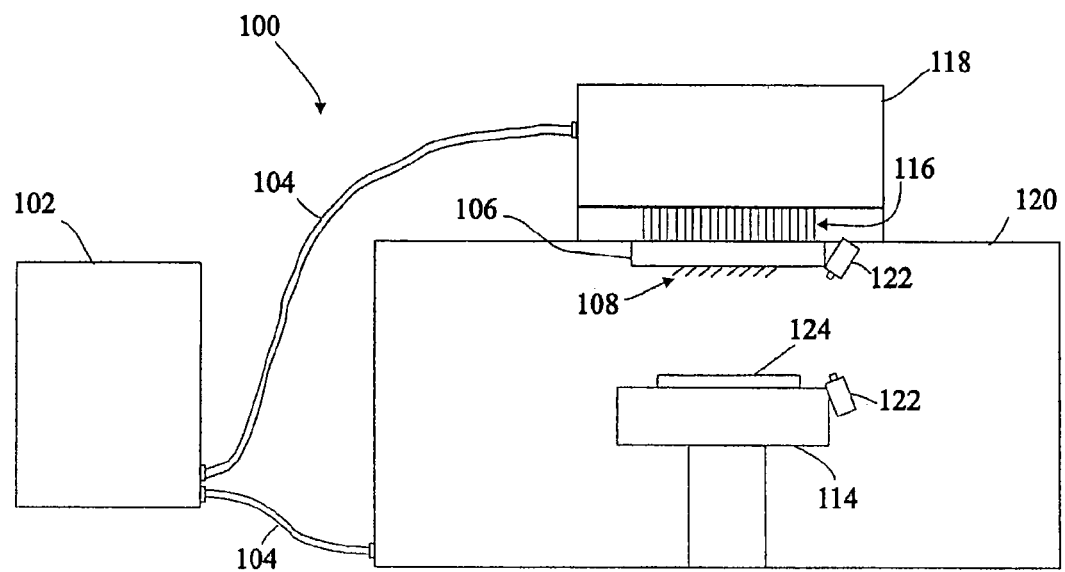
FIG. 1 illustrates an exemplary prior art semiconductor test system.
Figure 1:
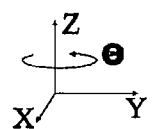
Figure 2A:
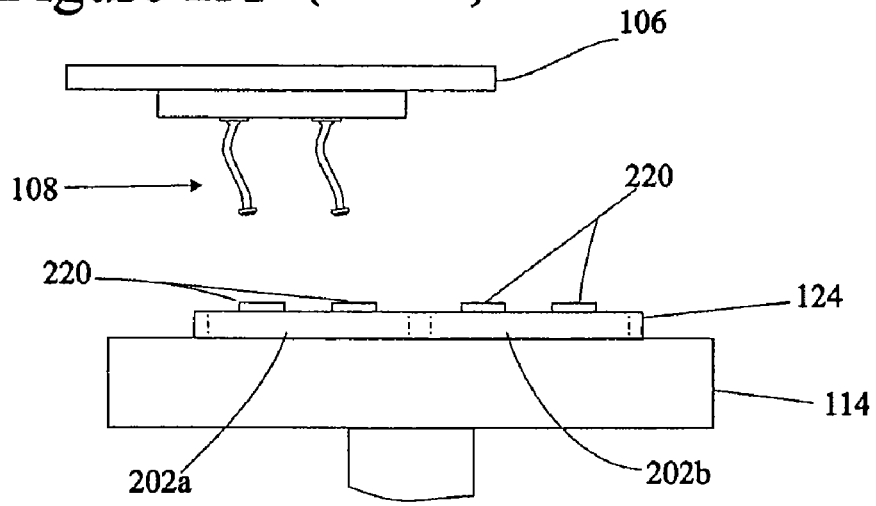
FIGS. 2A-2C illustrate operation of a portion of the exemplary test system illustrated in FIG. 1.
Figure 2B:
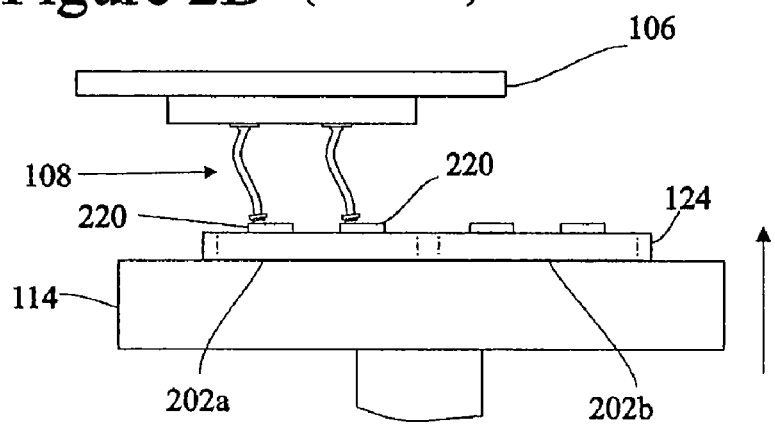
Figure 2C:
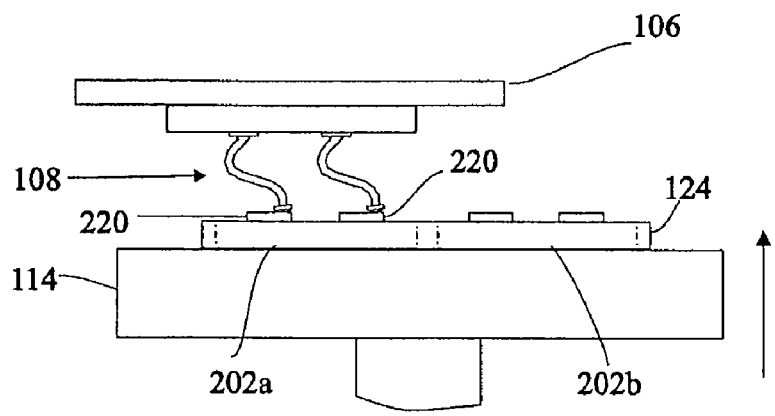

The exemplary semiconductor test system 400 illustrated in FIG. 3 is generally similar to the test system 100 shown in FIG. 1. That is, exemplary test system 400 includes a tester 402, one or more communication links 404, a prober 420, a test head 418, a probe card 406, and interconnections 416 between the probe card and the test head, all of which may be generally similar to like elements as described with respect to FIG. 1. The prober 420 may include a variety of elements such as one or more cameras 422, which may be generally similar to the cameras 122 illustrated in FIG. 1.

Probe card 406 may be any type of probe card, including without limitation a probe card 406 assembly as illustrated in U.S. Pat. Nos. 5,974,662 or 6,509,751, both of which are incorporated by reference herein in their entirety. Probes 408 may be any type of probes, including without limitation needle probes, buckling beam probes (e.g., "COBRA" probes), bumps, posts, and spring probes. Nonexclusive examples of spring probes include the spring contacts described in U.S. Pat. Nos. 5,917,707, 6,255,126, 6,475,822, and 6,491,968; and U.S. Patent Application Publication No. 2001/0044225 A1 and U.S. Patent Application Publication No. 2001/0012739 A1. The foregoing patents and patent application are incorporated herein by reference in their entirety.

As shown in FIG. 3, the test system 400 also includes a controller 430 for controlling movement of the chuck 414. For convenience (not by way of limitation), directions in FIG. 3 are identified using an "x," "y," "z," and "θ" coordinate system in which the "z" direction is the vertical direction (up or down) with respect to FIG. 3, the "x" direction is horizontally into or out of the page, the "y" direction is also horizontal but to the right or left in FIG. 3, and "θ" is rotation.

The controller 430 may be any suitable controller for controlling movement of the chuck 414. The controller 430 illustrated in FIG. 3 is a microprocessor based controller. As shown, controller 430 includes a digital memory 432, a microprocessor 434, input/output electronics 436, and input/output port 438. The digital memory 432 may be any type of memory including an electronic memory, an optical memory, a magnetic memory, or some combination of the foregoing. As just two examples, digital memory 432 may be a read only memory, or digital memory 432 may be a combination of a magnetic or optical disk and a random access memory. Microprocessor 434 executes instructions (e.g., software or microcode) stored in digital memory 432, and input/output electronics 436 controls input and output of electrical signals into and out of controller 430. Input data is received and output data is output via port 438. Control signals for controlling movement of chuck 414 are among data output via port 438. Such software or microcode may be configured to control the chuck movements described herein.

Controller 430 may be a stand alone entity as illustrated in FIG. 3. Alternatively, controller 430 may be contained within the prober 420. Indeed, a typical prober includes a microprocessor based control system for moving chuck 414, and controller 430 may comprise such an existing control system configured with software or microcode to execute the chuck movements described herein. Of course, the controller 430 may be located in other elements of system 400 or may be distributed among one or more elements of system 400.

The controller 430, however, need not be microprocessor based. Indeed, any system for controlling movements of chuck 414 may be used. In fact, controller 430 may comprise manual mechanisms by which an operator manually moves the chuck 414.

Figure 4:
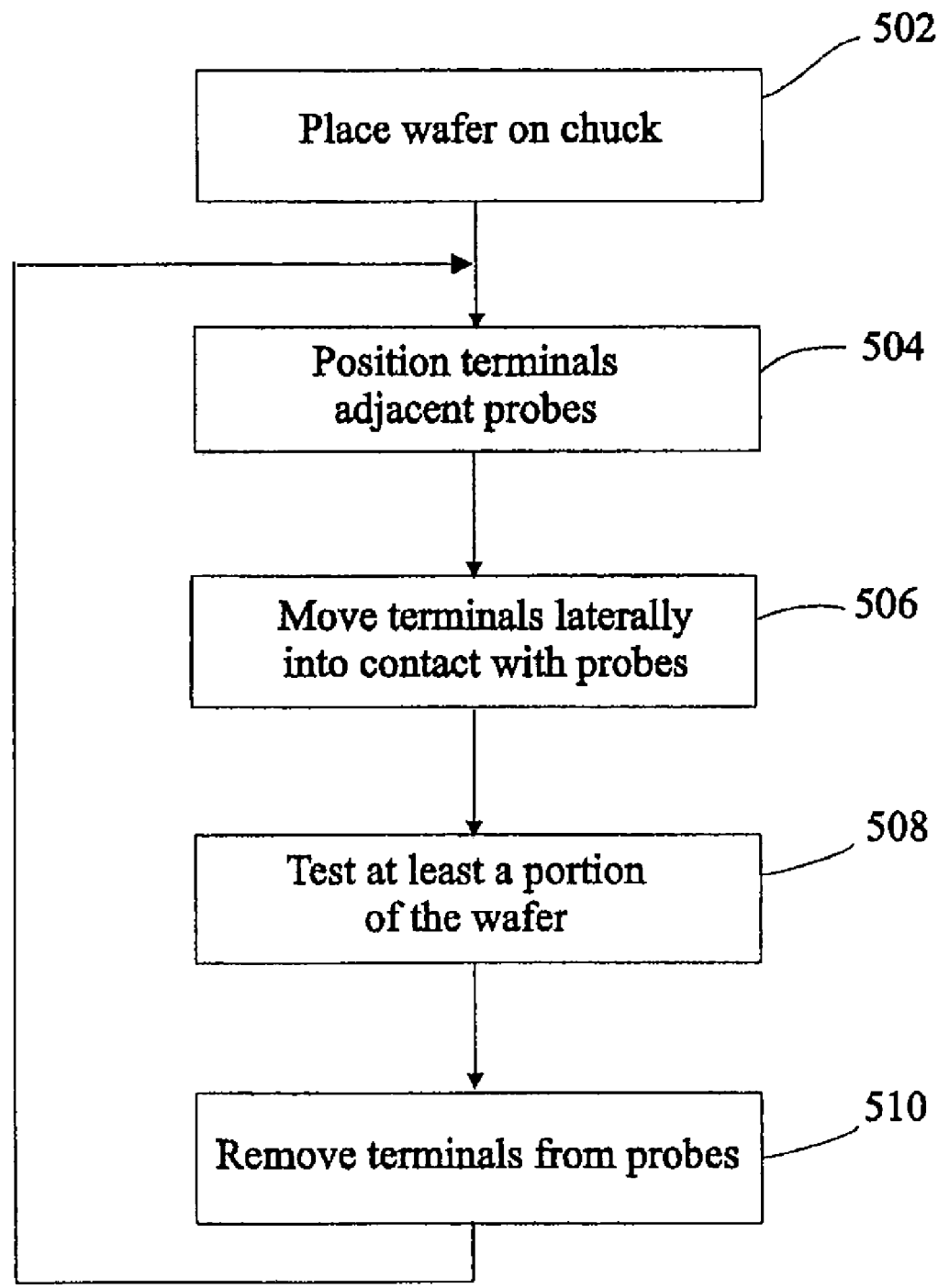
FIG. 4 illustrates an exemplary process for probing a semiconductor device.
Figure 5A:
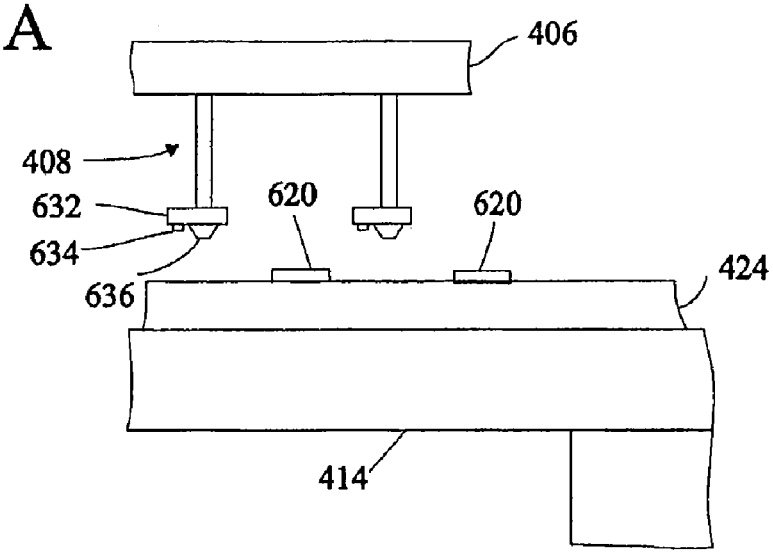
FIGS. 5A-5C illustrate an exemplary application of the process of FIG. 4.
Figure 5B:
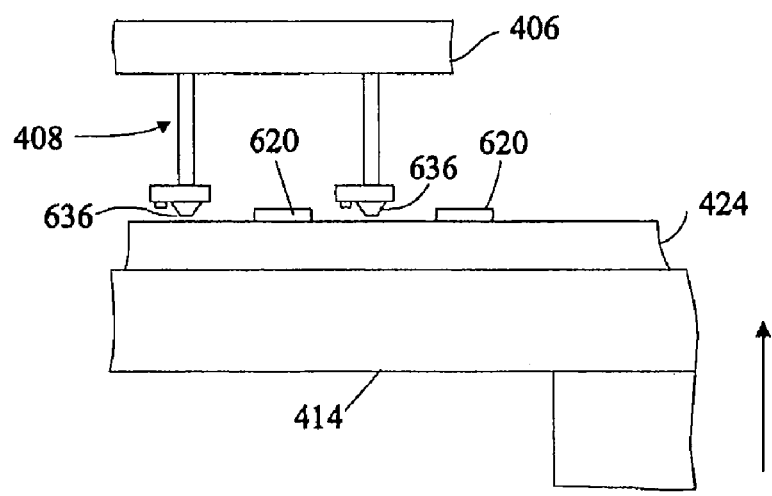

FIGS. 4 and 5A-5C illustrates an exemplary process for testing semiconductor wafers 424 utilizing the test system 400 shown in FIG. 3. As shown in FIGS. 4 and 5A, a wafer 424 to be tested is placed oil the chuck 414 (step 502). As shown in FIGS. 4 and 5B, the chuck 414 then moves the wafer 424 such that terminals 620 on the wafer 424 are brought into a position laterally adjacent tips 636 of probes 408 (step 504). As one example, and as shown in FIG. 5B, the terminals 620 may be positioned such that the tips 636 of probes 408 do not touch wafer 424 but are nevertheless positioned below the top surfaces of terminals 620. Of course, the wafer 424 could alternatively be held stationary and the probes 408 moved, or both the wafer 424 and the probes 408 could be moved. In the system shown in FIG. 3, software running in controller 430 may issue commands via I/O port 438 to control the movement of chuck 414.

Figure 5C:
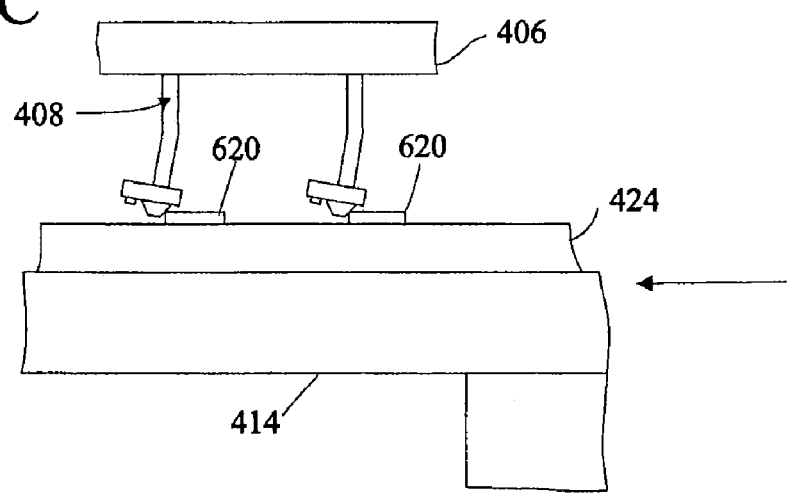

Cameras 422 may be used to determine the position of the tips 636 of the probes 408 with respect to the wafer 424. Optionally, alignment features 634 may be included on paddles 632 of probes 408 to aid in determining the position and alignment of tips 636. The use of exemplary alignment features is discussed in U.S. Patent Application Publication No. 2003/0013340 A1, which is incorporated by reference in its entirety herein. As shown in FIGS. 4 and 5C, the tips 636 of probes 408 are then moved horizontally into contact with terminals 620 (step 506). The terminals 620 may be pressed against the probes 408 such that the probes deform, as shown in FIG. 5C. Alternatively, the movement may cause the tips of probes 408 to hop onto the surfaces of terminals 620.

It should be noted that the horizontal motion of step 506 may be followed by some other type of motion. For example, a vertical or a vertical up and down motion may be implemented to ensure that a relatively high force connection is established between the probes and the wafer. Other or additional motions are possible, including further horizontal motions.

Still referring to FIGS. 4 and 5A-5C, with the probes 408 in contact with terminals 620, test signals are provide to the terminals through probe card 406, and response data generated by the die or dies to which the terminals are attached are sensed by certain of the probes 408 (step 508). For example, such test signals may be generated by a tester 402. Once the testing is complete, the probes 408 and the terminals 620 are brought out of contact with each other (step 510). Again, in a system such as the one shown in FIG. 3, the chuck 414 moves the wafer 424 while the probe card 406 remains stationary. The path or directions of the movement used to remove probes 408 and terminals 620 from contact with each other are not critical, and any paths or directions may be used. Nonlimiting examples of suitable paths include the reverse of the movement used to bring the wafer 424 into contact with the probes 408, simply moving the wafer in the "z" direction away from the probes, and movement consistent with the type of device being tested and continued use of the device. Controller 430 may be configured to move the wafer 424 away from probes 408 using any of these or other ways, and controller 430 may do so by executing software and issuing control signals that control movement of chuck 414. Steps 502-510 may then be repeated until all or at least a portion of the dies on the wafer 424 have been tested.

Figure 6A:
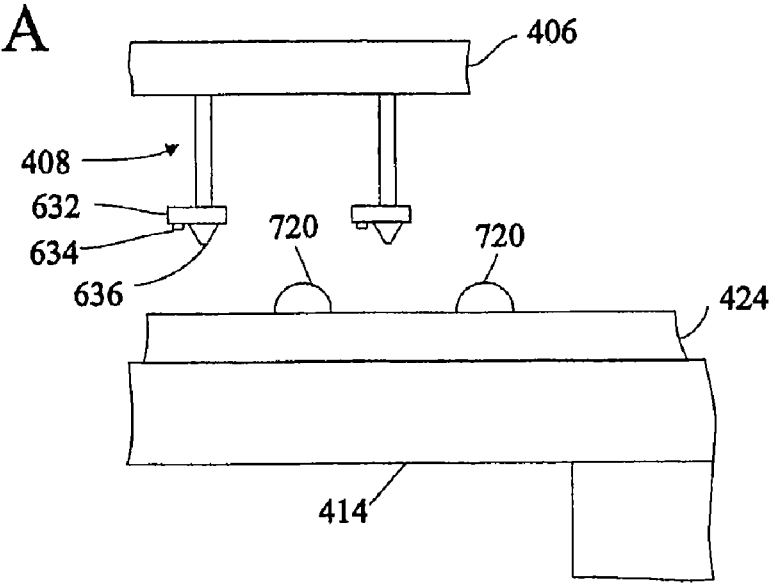
FIGS. 6A-6C illustrate another exemplary application of the process of FIG. 4.
Figure 6B:
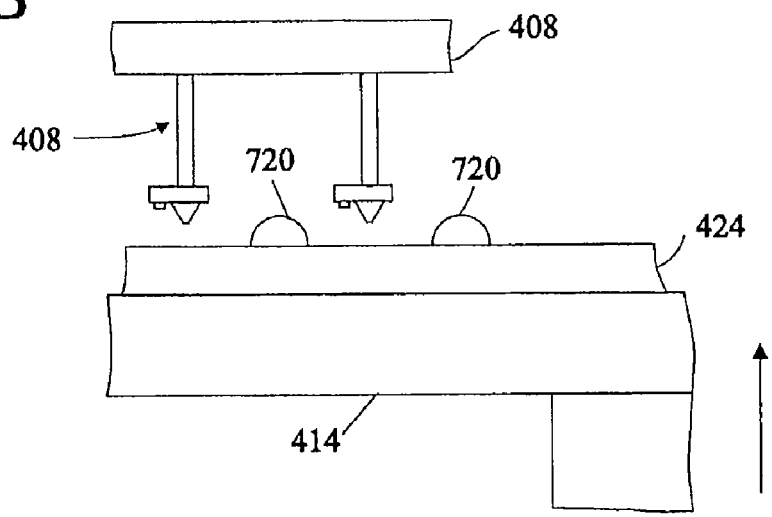
Figure 6C:
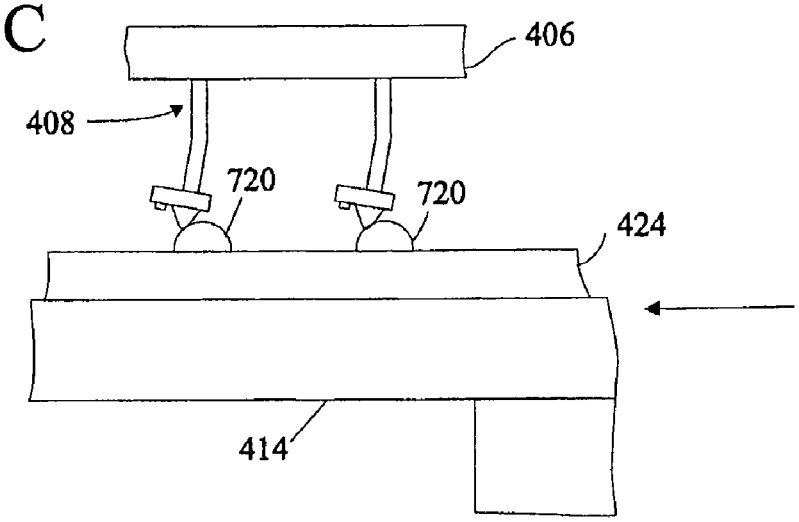

Terminals 620 may be any type of terminals, including without limitation flat terminals as shown in FIGS. 5A-5C as well as other shaped terminals, such as the spherically shaped terminals (e.g., solder balls) shown in FIGS. 6A-6C. FIGS. 6A-6C illustrate an exemplary application of the process shown in FIG. 4 where the terminals 720 on wafer 424 are spherically shaped. Otherwise, the process shown in FIGS. 6A-6C may be generally similar to the process illustrated in FIGS. 5A-5C.

Figure 7:
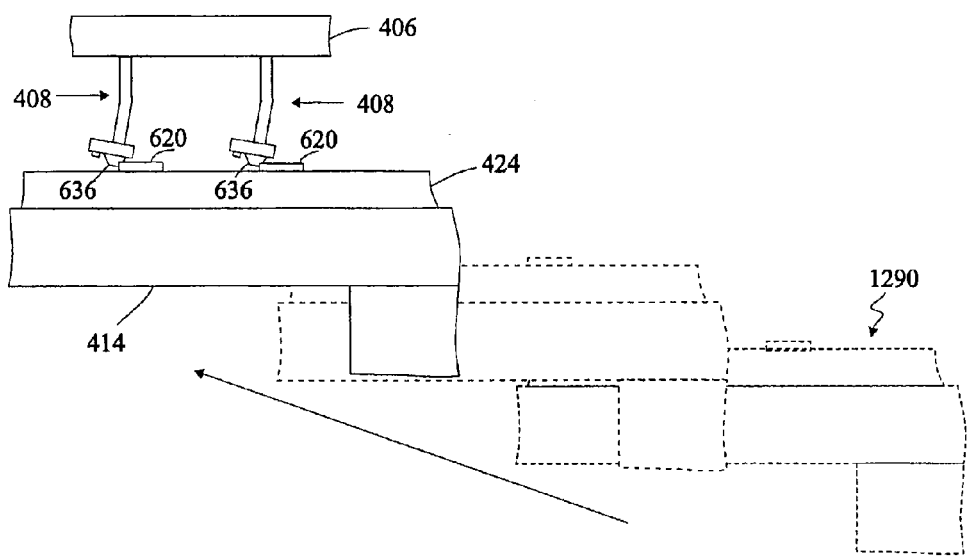
FIG. 7 illustrates a modified exemplary application of the process of FIG. 4.

FIG. 7 illustrates an exemplary variation of the process shown in FIG. 4. As shown in FIG. 7, after the wafer 424 is placed on the chuck, the chuck 414 is moved to position the wafer 424 in a position 1290 in which the terminals 620 on the wafer 424 are initially positioned 1290 diagonally adjacent the probes 408. As also shown in FIG. 7, the chuck 414 moves the wafer 424 diagonally into contact with the tips 636 of probes 408. Of course, terminals 620 may be any type of terminal, including without limitation spherically shaped terminals, such as terminals 720 shown in FIGS. 6A-6C.

Figure 8A:
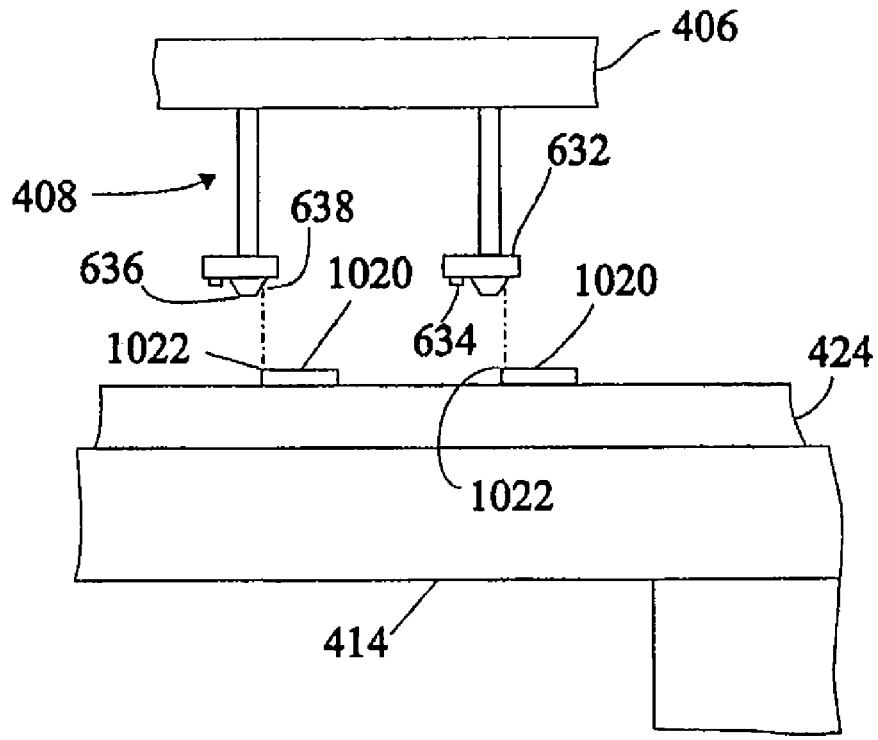
FIGS. 8A and 8B illustrate another exemplary process for probing a semiconductor device.
Figure 8B:
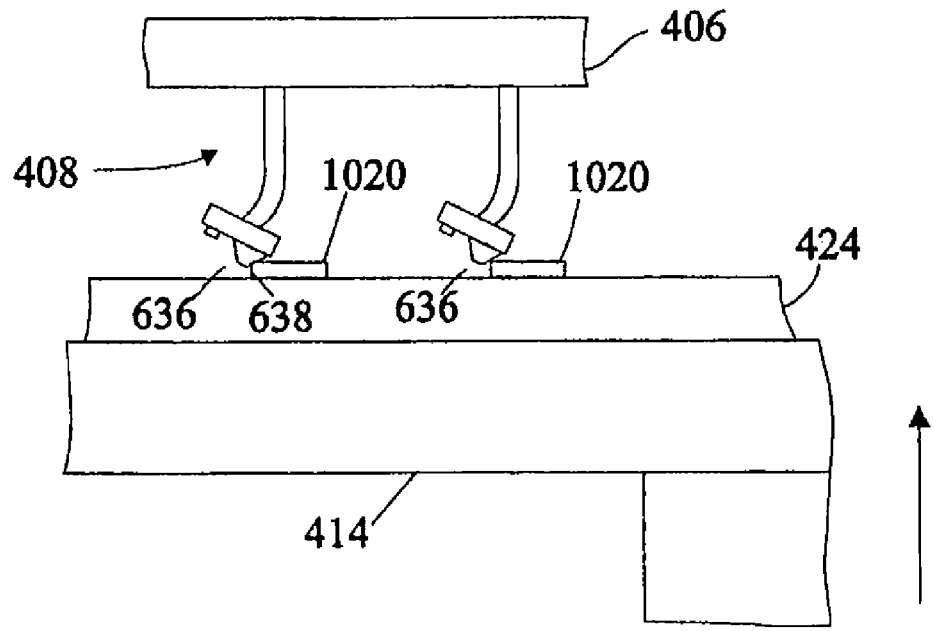

FIGS. 8A and 8B illustrate another variation of the exemplary processes shown in FIG. 4. As shown in FIG. 8A, terminals 1020 of wafer 424 are initially positioned below probes 408. Also as shown in FIG. 8A, a sloped face or edge 638 of a probe tip 636 is aligned with a corner edge 1022 of a terminal 1020. Then, as shown in FIG. 8B, chuck 414 moves wafer 424 upward into contact with probe tips 636. As the corner edge 1022 of terminal 1020 comes into contact with and then slides along the sloped face or edge 638 of probe tip 636, the probe 408 is deflected as shown in FIG. 8B, creating a pressure contact between probe tips 636 and terminals 1020 Optionally, the distance by which tip 636 extends away from paddle 632 may be made to be less than the height of terminals 1020 from the surface of wafer 424. In this way, paddle 632 may act as a stop, preventing tips 636 from contacting the surface of wafer 424.

Figure 9A:
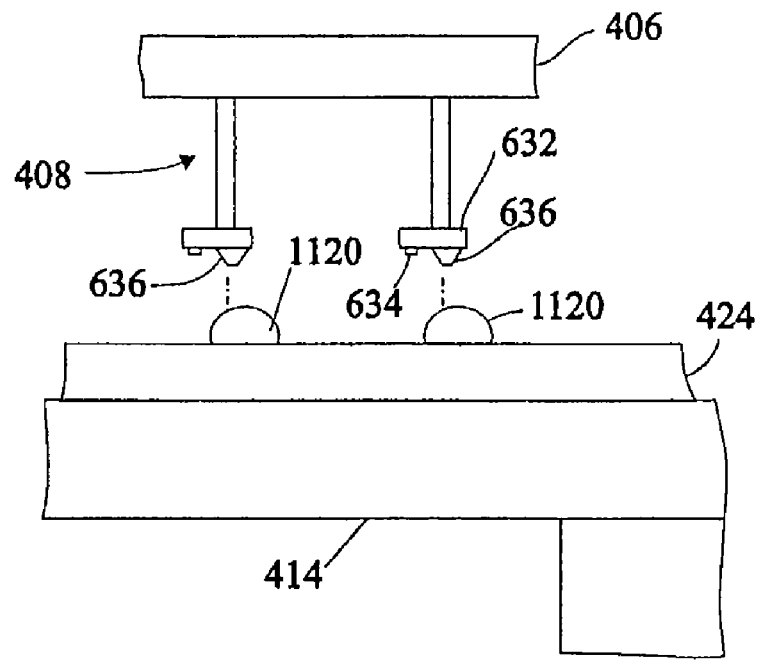
FIGS. 9A and 9B illustrate yet another exemplary process for probing a semiconductor device.
Figure 9B:
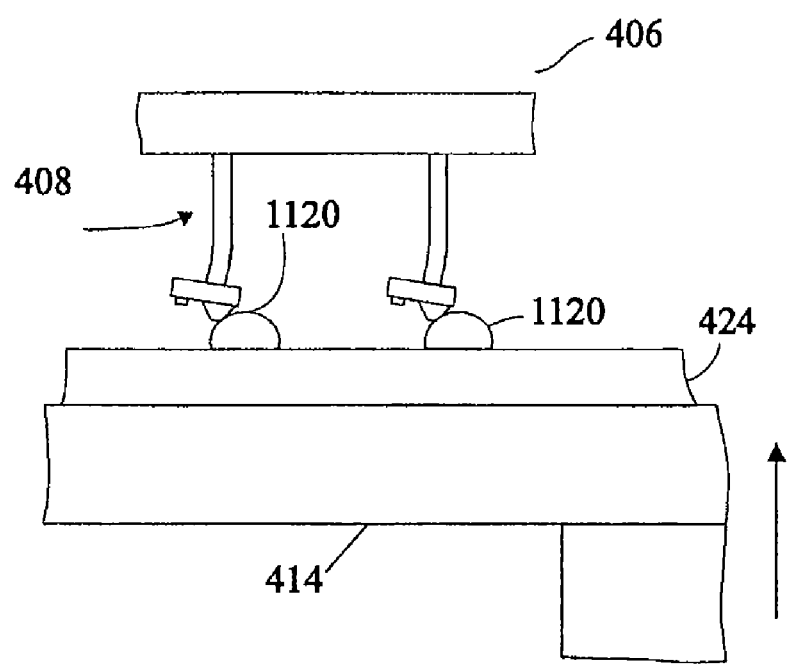

FIGS. 9A and 9B illustrate a variation of the exemplary process shown in FIGS. 8A and 8B. As shown, wafer 424 in FIGS. 9A and 9B have rounded terminals 1120. As shown in FIG. 9A, terminals 1120 of wafer 424 are positioned below probes 408. Preferably, a tip 636 of a probe 408 is aligned off center with a terminal 1120. Then, chuck 414 moves wafer 424 upward into contact with probe tips 636, as shown in FIG. 9B. After a probe tip 636 comes into contact with a terminal 1120, the probe Lip slides along the periphery of the terminal, which may cause the probe 408 to deflect as shown in FIG. 9B, creating a pressure contact between probe tips 636 and terminals 1120.

Figure 10A:
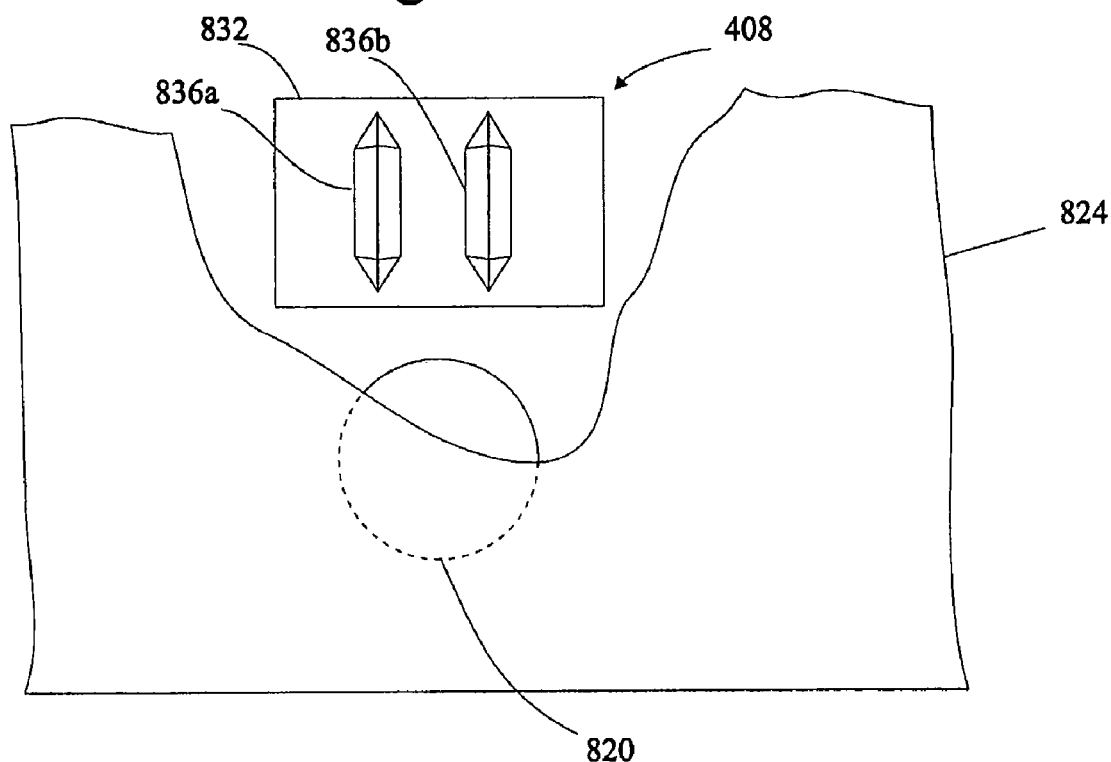
FIGS. 10A and 10B illustrate an exemplary probe with multiple tips.
Figure 10B:
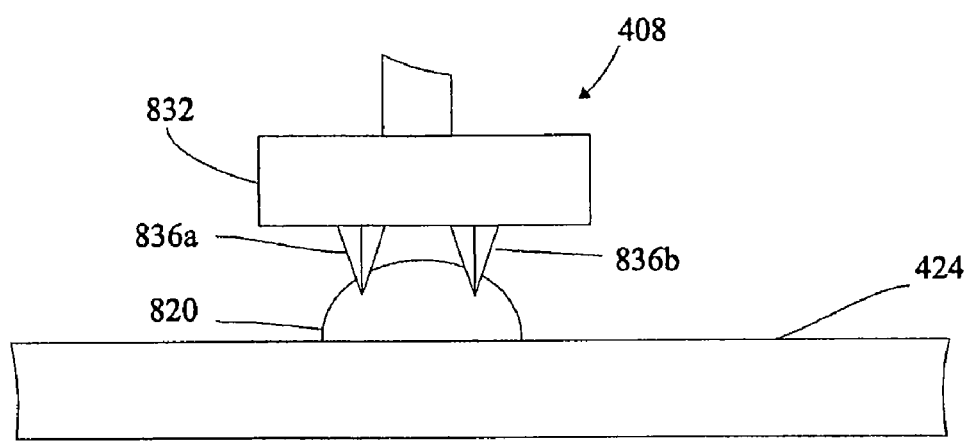

FIGS. 10A and 10B illustrate use of a probe 408 with two contact tips 836a, 836b disposed on a paddle 832 of probe 408, which may be particularly advantageous with rounded terminals 820. (FIG. 10A shows a partial bottom view of wafer 824 with a cut-away portion revealing the bottom of probe 408 and a portion of terminal 820). Two (or more) tips 836a, 836b may be particularly useful in "grabbing" rounded terminals 820.

Figure 11A:
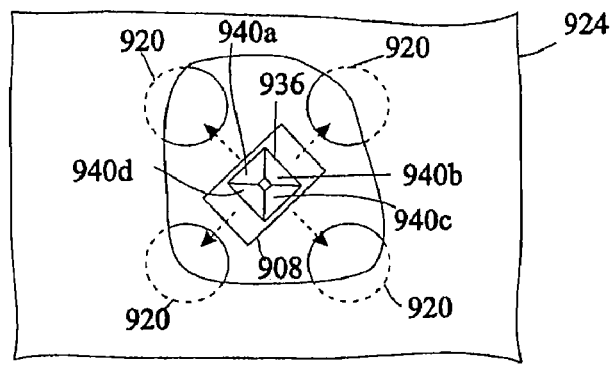
FIGS. 11A-11C illustrate exemplary positioning and movement of a probe with respect to multiple terminals.
Figure 11B:
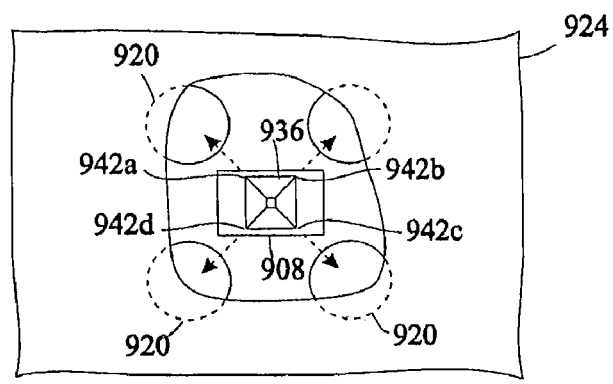

Each tip of each probe may have a plurality of contact features, and such contact features may be alternatingly used to contact a terminal. For example, probe 908 in FIGS. 11A and 11B has a truncated-pyramid-shaped tip 936, which has four faces 940a-940d (see FIG. 11A) and four edges 942a-942d (see FIG. 11B). (In FIGS. 11A and 11B, part of wafer 924 is cut away so that probe tip 936 and parts of terminals 920 are visible.) As shown in FIG. 11A, any one of the faces 940a-940d may make contact with a terminal 920. In the example shown in FIG. 11A, each face 940a-940d is a contact features. Faces 940a-940d may optionally be rounded. Alternatively (or in addition), as shown in FIG. 11B, any one of edges 942a-942d may contact a terminal 920. Thus, in FIG. 11B, edges 942a-942d are contact features. Of course, the faces 940a-940d and the edges 942a-942d may make contact, and each probe 908 may thus have eight contact features in the example shown in FIGS. 11A and 11B. Other shaped tips may be used, including without limitation round tips.

Figure 11C:
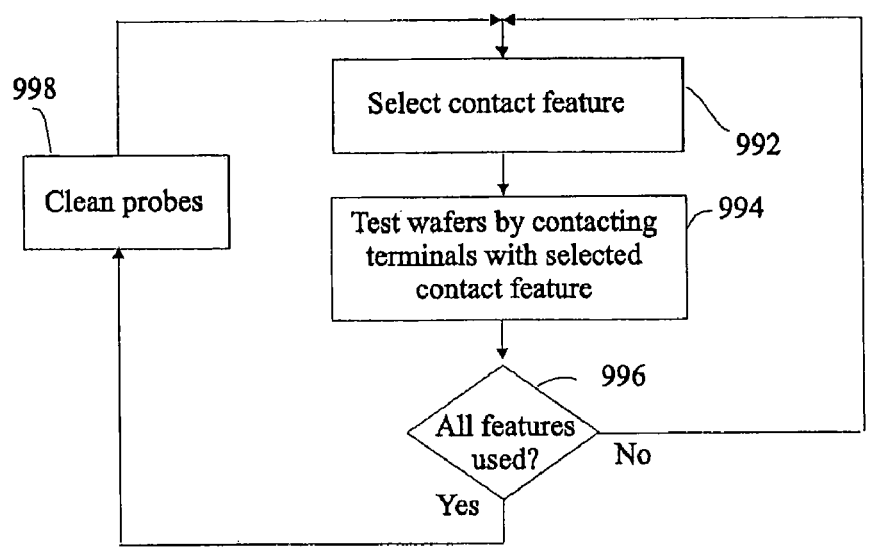

FIG. 11C illustrates a process in which the time between cleaning probes may be extended by using tips with multiple contact features, such as tip 936 in FIGS. 11A and 11B. (As is known, debris may accumulate on the tips of probes as terminals are brought into and out of contact with the probes.) As shown in FIG. 11C, one of a plurality of contact features of a probe is selected at step 992. For example, edge 942a of tip 936 in FIG. 9B may be selected. The testing of wafers then proceeds as in step 994. The testing involves repeatedly moving a series of terminals into and out of contact with the probe tips 936. Each time wafer terminals are brought into contact with probes, the contact feature selected at step 992 makes contact with the terminals. For example, if edge 942a of tip 936 is selected at step 992, edge 942a of tip 936 makes contact with a terminal during step 994. After the terminals are brought into and out of contact with probes a predetermined number of times, it is determined at step 996 whether all of the contact features of the probe have been used. The predetermined number of times may be any number; for example, the predetermined number of times may be the number of contacts this probe is to make between cleanings. Alternatively, rather than perform step 994 for a predetermined number of contacts between terminals and the probes, step 994 may be performed until the contact resistance between the probes and the terminals exceeds a predetermined threshold. If the determination at step 996 is no, the process returns to step 992 where a different one of the plurality of contact features is selected. For example, if edge 942a was initially selected at step 992, then edge 942b may be selected. Thereafter, step 994 is repeated, but this time the newly selected contact feature (e.g., edge 942b) makes the contacts with the wafer terminals at step 994. After the predetermined number of contacts with terminals discussed above, step 996 is repeated. If all of the contact features of the probe have now been used as determined at step 996, the probe tips are cleaned in step 998. For example, if all four edges 942a-942d of tip 936 have been selected and used to make contact with terminals as determined at step 996, the tip 936 is cleaned at step 992. Thereafter, the entire process is repeated as new wafers are tested.

Figure 12:
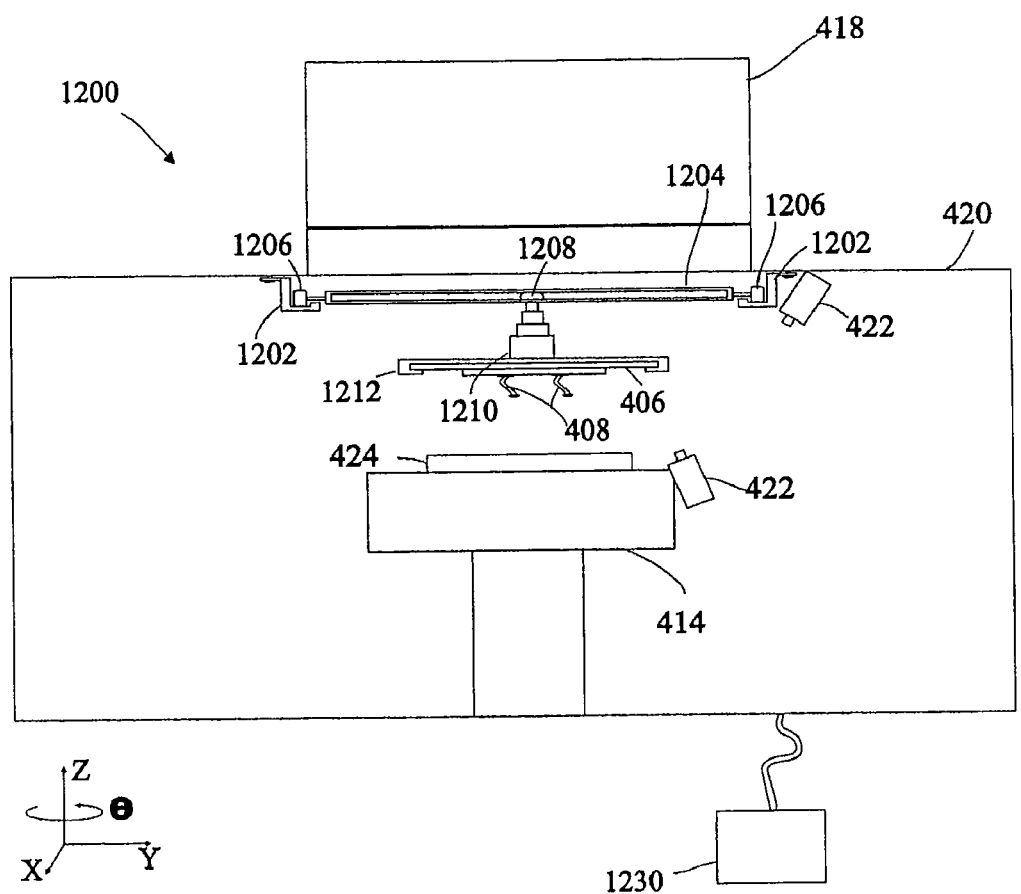
FIG. 12 illustrates another exemplary test system.

FIG. 12 shows an exemplary test system 1200 in which probe card 406 is capable of movement in the "x," "y," "z," and "θ" directions. Of course, movement could be allowed in only one of those directions or only in a combination of two of those directions. (As with FIG. 3 above, directions in FIG. 12 are identified using an "x," "y," "z," and "θ" coordinate system in which the "z" direction is the vertical direction (up or down) with respect to FIG. 12, the "x" direction is horizontally into or out of the page, the "y" direction is also horizontal but to the right or left in FIG. 12, and the "θ" direction is rotation. These directions are for convenience, however, and are not limiting).

The exemplary test system 1200 shown in FIG. 12 may be generally similar to the test system 400 illustrated in FIG. 3. The exemplary test system 1200 shown in FIG. 12, however, includes a first track 1204 to which the probe card 406 is attached with roller 1208, allowing the probe card 406 to move in the "y" direction shown in FIG. 12. Tracks 1202 and rollers 1206 allow the probe card 406 to move in the "x" direction, and telescoping and rotary actuator 1210, which includes element 1212 for holding the probe card 406, allows the probe card 406 to move in the "z" and "θ" directions. Motors (not shown) or other actuators (not shown) effect such movements of the probe card. Controller 1230 may be generally similar to controller 430 illustrated in FIG. 4 but modified to issue control signals that move both the chuck 414 and the probe card 406. (The chuck 414 may be similar to chuck 114 of FIG. 1). Of course, the chuck 414 could be held stationary and only the probe card 406 moved. Modified to include movement of the probe card 406, the exemplary processes described herein may otherwise be implemented in a system like that shown in FIG. 12.

Figure 13A:
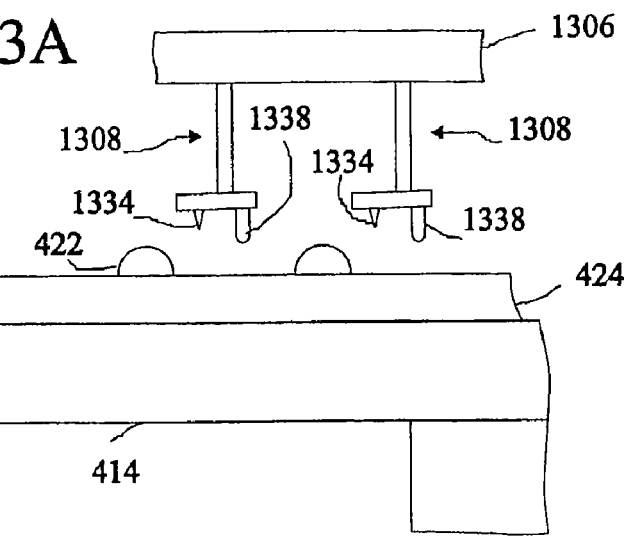
FIGS. 13A-13C illustrate still another exemplary process for probing a semiconductor device.
Figure 13B:
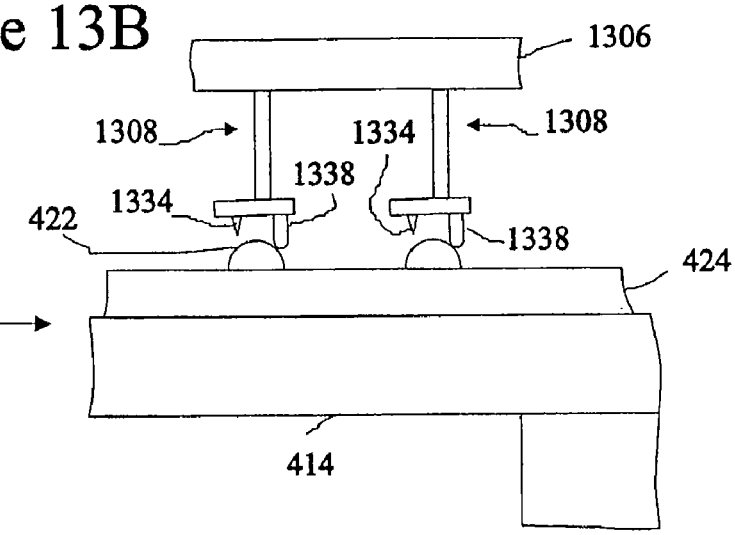
Figure 13C:
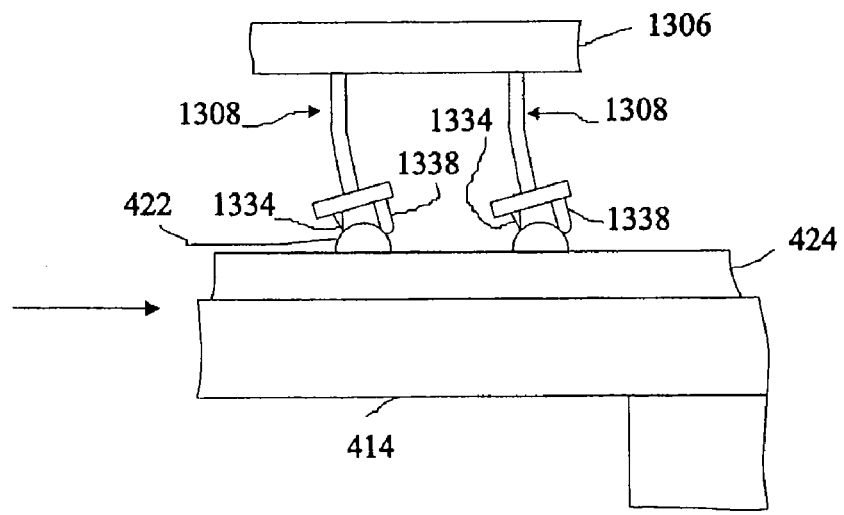

FIGS. 13A-13C illustrate an exemplary process in which two contact features 1334, 1338 on a probe 1308 are configured to make sequential contact with a terminal 422 of a wafer 424. That is, probes 1308, which are attached to element 1306, include a first contact feature 1338 and a second contact feature 1334. These contact features 1334, 1338 are configured and situated on probes 1308 so that a particular movement of wafer 424 by chuck 414 causes the first contact feature 1338 to contact terminal 422 and then the second contact feature 1334 to contact terminals 422.

In the example shown in FIGS. 13A-13C, the first contact feature 1338 is somewhat elongate, and the second contact feature 1334 is pointed. As shown in FIG. 13A, chuck 414 initially positions probes 1308 in proximity to terminals 422 of wafer 424. As shown in FIG. 13B, chuck 414 then moves wafer 424 so that the first contact feature 1338 of each probe 1308 contacts a terminal 422. As shown in FIG. 13C, the chuck 414 continues to move wafer 424, causing probes 1308 (which may be flexible and/or resilient) to bend and the second contact feature 1334 to contact the terminal 422. In the example shown in FIG. 13C, second contact 1334 is pointed and pierces terminal 422, thus penetrating any oxide or other contaminant on the surface of the terminal.

The particular configuration of contact features 1334, 1338 and the movement of wafer 424 shown in FIGS. 13A-13C is exemplary only. Any number, shape, and placement of contact features may be used on a probe, and any movement pattern may be implemented to cause a desired sequence of contacts of the contact features on a probe with a terminal.

It should be apparent that, in all of the exemplary processes described herein in which terminals are brought into contact with probe tips, after contact has been established, further movement of the terminals is possible. For example, further up-and-down motions and/or further horizontal back-and-forth motions of the terminals with respect to the probe tips after the terminals have been brought into contact with probes may reduce the contact electrical resistance between the probes and the terminals. Optionally, the contact resistance between the probes and the terminals may be monitored and movement of the chuck automatically controlled so that the contact resistance is always less than a predetermined threshold.

Any of the processes described herein may be implemented in a test system, such as the exemplary test systems shown in FIG. 3 or 12. As mentioned herein, the processes described herein may be implemented in other systems in which a probe is brought into contact with an object. Moreover, in any such system, the movements of the probe and/or the object may be implemented in software stored in a memory and executed on a processor (e.g., as illustrated in FIG. 3). Alternatively, the control of such movements may be implemented using electronic circuitry or a combination of software and circuitry.

Although the principles of the present invention have been illustrated and explained in the context of specific exemplary embodiments, various modifications can be made to the disclosed embodiments. For example, the foregoing descriptions refer to the components of the composite motion as "vertical" and "horizontal" movement components. The terms "vertical" and "horizontal" are relative, and other directional components may be used instead. As another example, the horizontal movement may include movements other than linear movement. For example, the horizontal movement may include a rotation in the horizontal (that is, "x, y") plane. As yet another example, although the exemplary embodiments described herein probe a semiconductor device, the invention is not so limited. Rather, the invention may be used in any system in which a probe is brought into contact with an object Many other modifications are possible.

What is claimed is:

1. A method of probing an electronic device, said electronic device comprising a surface comprising a plurality of terminals, said method comprising:

positioning said electronic device and a plurality of probes in a first relative position in which said probes are spaced apart from said electronic device and each contact tip of ones of said probes is offset in a direction parallel to said surface of said electronic device from a corresponding terminal of said electronic device that said contact tip is to contact; and effecting relative movement of said electronic device and said probes, said relative movement resulting in said electronic device and said probes being in a second relative position in which said contact tips of said ones of said probes physically contact said corresponding terminals, wherein said relative movement from said first relative position to said second relative position comprises a first directional component and a simultaneous second directional component, wherein said first directional component is parallel to said surface of said electronic device and said second directional component is perpendicular to said surface of said electronic device.

2. A method of probing an electronic device, said electronic device comprising a surface comprising a plurality of terminals, said method comprising:

positioning said electronic device and a plurality of probes in a first relative position in which said probes are spaced apart from said electronic device; and effecting relative movement of said electronic device and said probes, said relative movement resulting in said electronic device and said probes being in a second relative position in which ones of said probes physically contact ones of said terminals, wherein:

said relative movement comprises a first directional component that is parallel to said surface of said electronic device, and said effecting relative movement comprises moving at least one of said probes or said electronic device without reversing a direction of movement of said at least one of said probes or said electronic device, wherein said ones of said terminals extend from said surface of said electronic device by a distance "d," and said positioning said electronic device and a plurality of probes comprises positioning contact portions of said probes less than said distance "d" from said surface of said electronic device.

3. The method of claim 1, wherein said terminals comprise elements raised above the surface of the electronic device.

4. The method of claim 1, wherein said terminals comprise flat pads.

5. The method of claim 1, wherein said terminals comprise partial spheres.

6. The method of claim 1, wherein each said probe comprises a plurality of tips.

7. The method of claim 1 further comprising testing said electronic device while said ones of said probes are in contact with said ones of said terminals.

8. The method of claim 1, wherein said electronic device comprises a semiconductor device.

9. The method of claim 1, wherein said electronic device comprises a semiconductor wafer.

10. The method of claim 1, wherein said electronic device comprises a package for a semiconductor device.

11. The method of claim 1, wherein said electronic device comprises a package for a plurality of semiconductor devices.

12. The method of claim 1, wherein said electronic device comprises a semiconductor die.

13. The method of claim 1, wherein said electronic device comprises a plurality of semiconductor dies.

14. The method of claim 1, wherein said electronic device comprises a printed circuit board.

15. The method of claim 1, wherein said electronic device comprises a ceramic space transformer.

16. The method of claim 1, wherein said electronic device comprises:

a wiring board; and a plurality of semiconductor devices electrically connected to said wiring board.

17. A program product for use in conjunction with a probing machine, the program product comprising a readable storage medium and a program mechanism embedded therein, the program mechanism comprising:

instructions for generating first signals to position an electronic device and a plurality of probes in a first relative position in which said probes are spaced apart from said electronic device and each contact tip of ones of said probes is offset in a direction parallel to a surface of said electronic device from a corresponding terminal on said surface of said electronic device that said contact tip is to contact; and instructions for generating second signals effecting relative movement of said electronic device and said probes to bring said electronic device and said probes into a second relative position in which said contact tips of said ones of said probes physically contact corresponding terminals, wherein said relative movement from said first relative position to said second relative position comprises a first directional component and a simultaneous second directional component, wherein said first directional component is parallel to said surface of said electronic device and said second directional component is perpendicular to said surface.

18. A program product for use in conjunction with a probing machine, the program product comprising a readable storage medium and a program mechanism embedded therein, the program mechanism comprising:

instructions for generating first signals to position an electronic device and a plurality of probes in a first relative position in which said probes are spaced apart from said electronic device; and instructions for generating second signals effecting relative movement of said electronic device and said probes to bring said electronic device and said probes into a second relative position in which ones of said probes physically contact ones of terminals composing a surface of said electronic device, wherein said relative movement comprises a directional component that is parallel to said surface of said electronic device, and said effecting relative movement comprises moving at least one of said probes or said electronic device without reversing a direction of movement of said at least one of said probes or said electronic device, wherein said terminals extend from a surface of said electronic device by a distance "d," and said generating first signals comprises positioning contact portions of said probes less than said distance "d" from said surface of said electronic device.

19. The program product of claim 17, wherein each said probe comprises a plurality of tips.

20. The program product of claim 17, wherein all of said relative movement from said first position to said second position effected by said second signals consists solely of movement of at least one of said probes or said electronic device in a an unchanging direction.

21. The program product of claim 17, wherein all of said relative movement from said first position to said second position effected by said second signals consists solely of movement of said electronic device in an unchanging direction.

22. The program product of claim 17, wherein all of said relative movement from said first position to said second position effected by said second signals consists solely of movement of at least one of said probes or said electronic device in a substantially straight line from said first relative position to said second relative position.

23. The program product of claim 17, wherein all of said relative movement from said first position to said second position effected by said second signals consists solely of movement of said electronic device in a substantially straight line from said first relative position to said second relative position.

24. The program product of claim 17, wherein said first signals and said second signals control movement of a chuck on which said electronic device is disposed, and said probes are not moved.

25. The method of claim 1, wherein all of said relative movement from said first position to said second position consists solely of movement of at least one of said probes or said electronic device in an unchanging direction.

26. The method of claim 1, wherein all of said relative movement from said first position to said second position consists solely of movement of said electronic device in an unchanging direction.

27. The method of claim 1, wherein all of said relative movement from said first position to said second position consists solely of movement of at least one of said probes or said electronic device in a substantially straight line from said first relative position to said second relative position.

28. The method of claim 1, wherein all of said relative movement from said first position to said second position consists solely of movement of said electronic device in a substantially straight line from said first relative position to said second relative position.

29. The method of claim 1, wherein all of said relative movement from said first position to said second position consists solely of movement of at least one of said probes or said electronic without reversing a direction of movement of said at least one of said probes or said electronic.

30. The program product of claim 17, wherein all of said relative movement from said first position to said second position effected by said second signals consists solely of movement of at least one of said probes or said electronic without reversing a direction of movement of said at least one of said probes or said electronic.

* * * * *